United States Patent [19]
Childers

[11] Patent Number: 4,771,264
[45] Date of Patent: Sep. 13, 1988

[54] INFO_1 DETECTION

[75] Inventor: Brian A. Childers, Santa Clara, Calif.

[73] Assignee: Advanced Micro Devices, Inc., Sunnyvale, Calif.

[21] Appl. No.: 891,074

[22] Filed: Jul. 28, 1986

[51] Int. Cl.[4] .............................................. G06F 7/02
[52] U.S. Cl. ............................ 340/146.2; 364/715.11
[58] Field of Search ............. 340/146.2, 825.3, 825.34; 364/715, 724; 370/100, 105, 110.1, 110.3; 375/111, 114, 116

[56] References Cited

U.S. PATENT DOCUMENTS

| | | | |
|---|---|---|---|
| 3,760,355 | 9/1973 | Bruckert | 340/146.2 |
| 3,832,685 | 8/1974 | Hendrickson | 340/146.2 |
| 3,855,576 | 12/1974 | Braun et al. | 340/146.2 |
| 4,414,676 | 11/1983 | Kraul et al. | 375/116 |
| 4,513,419 | 4/1985 | Small | 371/29 |
| 4,611,336 | 9/1986 | Fryer | 375/111 |
| 4,697,276 | 9/1987 | Skoog | 375/114 |

Primary Examiner—Gary V. Harkcom
Assistant Examiner—Tan V. Mai
Attorney, Agent, or Firm—Kenneth B. Salomon; J. Vincent Tortolano

[57] ABSTRACT

Method of detecting the INFO_1 signal pattern which avoids false activation of a data transmission line caused by noise on the line. An initial line sampling rate four times the nominal 192 kbs line rate is used to detect a HIGH mark to avoid the difficulties resulting from sampling right at the edge of a mark. Subsequent sampling is done at the nominal line rate to detect two opposite polarity marks out of every consecutive eight-bit time periods. If six consecutive eight-bit time periods are detected, each having its HIGH and LOW marks in the same relative positions, the line is activated. The method is readily implemented as a set of three "state machines" and consequently can be constructed from programmable logic arrays.

6 Claims, 3 Drawing Sheets

INFO 1 DETECTION

This invention relates to data transmission and, more particularly, to the detection of the INFO—1 signal pattern specified by the CCITT I-Series for Integrated Services Digital Networks.

BACKGROUND OF THE INVENTION

The Committee Consultative International Telephone and Telegraphique (CCITT) has drafted standards for Integrated Services Digital Networks (ISDN); the so-called "I-Series Recommendations". The I.400 Series Recommendations define the User-Network Interface; in particular, the I.430 Recommendations specify so-called INFO—0, INFO—1, INFO—2, INFO—3 and INFO—4 signals at the "S" and "T" reference points. Familiarity with these Recommendations is helpful to an understanding of the instant invention and they are incorporated by reference herein.

The INFO—1 signal is defined as a signal from terminal equipment (TE) to network termination (NT) consisting of a continuous pattern of a positive-going pulse ("HIGH mark") followed by a negative-going pulse ("LOW mark"), followed by a series of six bit-time periods of no pulses (six "spaces"); the nominal speed of rotation being 192 kilobits per second (kbs).

Upon reception of the INFO—1 signal, activation of the NT equipment should begin as quickly as possible to avoid loss of data and/or to minimize transmission times. On the other hand, false activation of the NT equipment should be avoided. Presently, signals on the line upon which data is transmitted and sampled at the 192 kbs rate. Reception of the high mark and low mark during any consecutive eight bit time periods causes activation of the NT. Such a technique may cause false activation of the line because a noise signal may contain a HIGH mark and a LOW mark during eight consecutive bit time periods.

Another problem with this technique is that the clock used by the TE for transmission is asynchronous with respect to the clock used by the NT, prior to, and during activation. Furthermore, several TE's could attempt simultaneous activation requests, resulting in several asynchronous INFO—1 signals becoming superimposed on the line.

SUMMARY OF THE INVENTION

Familiarity with the CCITT "I-Series Recommendations" is important to an understanding of the instant invention. Those Recommendations are hereby incorporated by reference.

The INFO—1 detection technique of the instant invention initially samples the signals received on the line at a higher rate than the 192 kbs nominal rate; such as four or eight times this rate. Once a high mark is detected, the line sampling occurs at the 192 kbs rate. The recognition criterion employed by the invention is that at least two signals out of every consecutive eight bit time periods are marks of different polarity; six consecutive eight-bit time periods satisfying this criterion are deemed to indicate reception of the INFO—1 pattern and activation is initiated, provided the HIGH and LOW mark signals with the eight-bit time periods occur in the same relative positions during all six frames.

Sampling the line at an initial rate higher than the nominal rate avoids difficulties of a sample occurring exactly at the leading edge of a mark, which may lead to incorrect results. Furthermore, the use of six consecutive eight-bit time periods, and the requirement that within each period the marks occur in the same relative positions, imposes a rigorous criterion for detection of INFO—1 which greatly diminishes the likelihood of false activation of the line.

The INFO—1 detection technique of the instant invention can be implemented as a collection of programmable logic arrays (PLAs). This avoids the use of expensive "random logic" construction and allows for structured design and ready detection and correction of errors. Furthermore, the technique can be redesigned to a particular application with minimal cost and time.

DETAILED DESCRIPTION OF A PREFERRED EMBODIMENT

Figure 1:
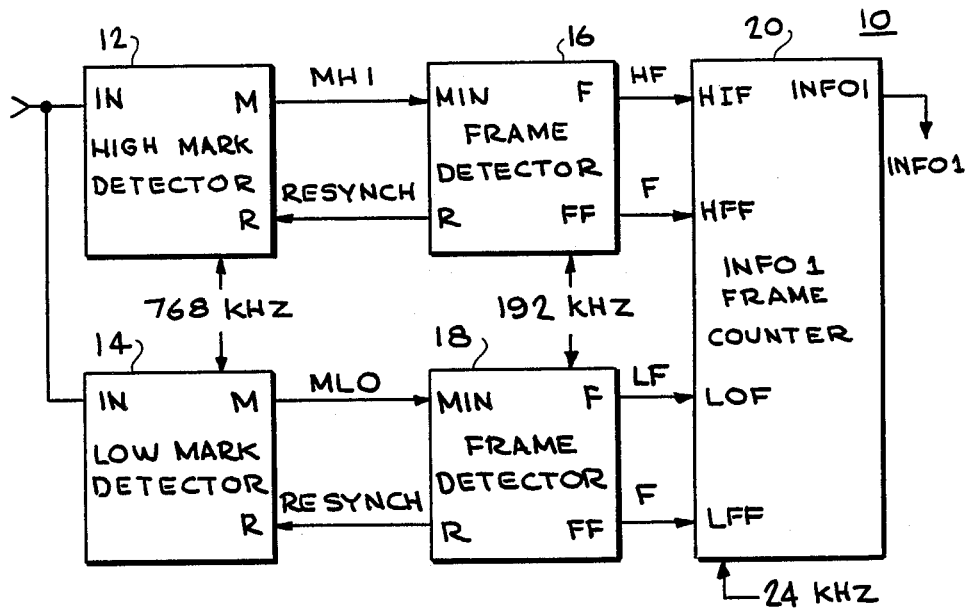
FIG. 1 is a block diagram of an INFO—1 detector according to the instant invention.

FIG. 1 illustrates in block diagram form a detector 10 employing the INFO—1 detection technique of the instant invention. A HIGH mark detection 12 receives at an input (IN) terminal the signals from the line upon which data is transmitted at a nominal rate of 192 kbs. Detector 12 receives 768 kbs clock signals (from a source not shown in FIG. 1) which determines the rate at which detector 12 samples the signals applied at its IN terminal. A HIGH mark (MHI) signal is generated at a mark (M) terminal of detector 12 synchronized with any HIGH mark signal received at the IN terminal two 768 kbs sample periods following reception of the HIGH mark at the IN terminal, provided the sampled signal at the IN terminal has remained HIGH. This latter requirement providing better immunity to noise.

A LOW mark detector 14 also receives at an input (IN) terminal the line signals and the 768 kbs clock signals. A LOW mark (MLO) signal is generated at a mark (M) terminal of detector 14 synchronized with any LOW mark signal received at the IN terminal two 768 kbs sample periods following reception of the LOW mark at the IN terminal, provided the sampled signal at the IN terminal has remained HIGH.

A signal may be applied at a reset (R) terminal of detectors 12 and 14 to terminate generation of the MHI and MLO signals at their M terminals, respectively. The HIGH mark and LOW mark detectors 12 and 14 will then begin sampling of the signals applied at their IN terminals and generate MHI and MLO signals, respectively, as described in the preceding paragraphs upon reception of a HIGH and LOW mark, respectively.

The MHI and MLO signals are conducted to a mark in (MIN) terminal of a frame detector 16 and frame detector 18, respectively. Frame detectors 16 and 18 receive 192 kbs local clock signals (from a source not shown in FIG. 1). Frame detectors 16 and 18 sample the mark signals received at their MIN terminals initially at one bit time periods (192 kbs) until a mark signal is detected, and thereafter at eight bit time periods of the 192 kbs clock also ascertaining that the relative position requirement of the MHI and MLO signals is met, i.e., that they occur in periods of eight bits for six consecutive frames. Detectors 16 and 18 generate at a frame (F) terminal a high-frame (HF) or low-frame (LF) signal indicating reception of MHI signals or MLO signals, respectively, at eight-bit time intervals.

Frame detector 16 and 18 cease generating the HF and LF signals, respectively, whenever consecutive MHI or MLO signals, respectively, are not received at eight-bit time period intervals. Frame detector 16 and 18 then generate the a resynchronization (12) terminal a resynchronization (RESYNCH) signal conducted to the R input terminal of HIGH mark detector 12 and LOW mark detector 14, respectively. Frame detectors 16 and 18 generate at a first frame (FF) terminal a first frame (F) signal indicating that the HF or LF signal being generated thereby is the first frame since a resynchronization signal has been generated thereby.

The HF and F, and LF and F, signals generated by the frame detectors 16 and 18, respectively, are conducted to a high frame (HIF), a high first frame (HFF), a low frame (LOF) and a low first frame (LFF) input terminal; respectively, of an INFO__1 frame counter 20. INFO__1 frame counter 20 also receives 24 kbs clock signals (from a source not shown in FIG. 1) to sample the signals applied at its HIF, HFF, LOF and LFF input terminals. Frame counter 20 detects an INFO__1 criterion upon reception at the IN terminals of detectors 12 and 14 of six consecutive frames having first a HIGH mark and then a LOW mark. This is determined by reception of both the HF and LF signals for six consecutive 24 kbs time intervals with the additional requirement that neither the HFF nor the LFF signals are received after the first reception of both the HF and LF signals.

If either the HF or the LF signals are received by INFO__1 frame counter 20, the counter 20 is reset and a new count is begun. A signal is generated at an INFO__1 output terminal of counter 20 when the INFO__1 criterion is satisfied.

Figure 2A:
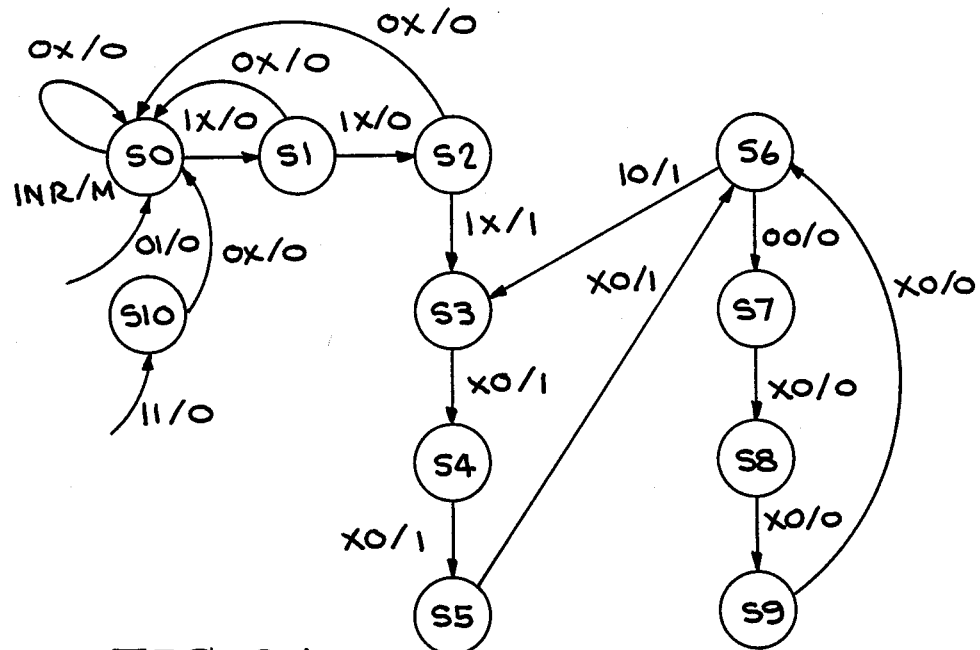
FIGS. 2A, 2B are 2C are three state diagrams of the blocks employed in the INFO—1 detection of the instant invention.
Figure 2B:
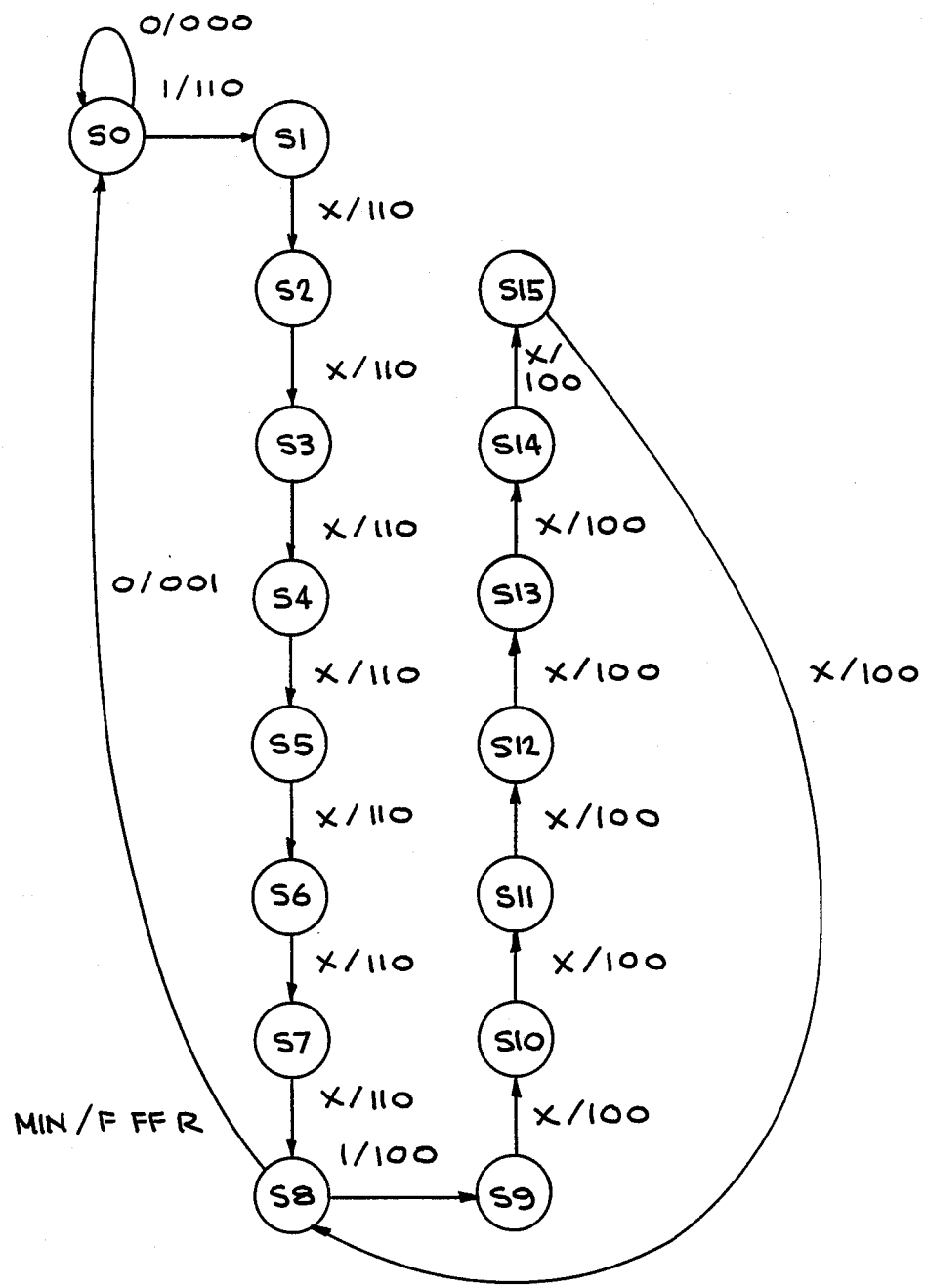
Figure 2C:
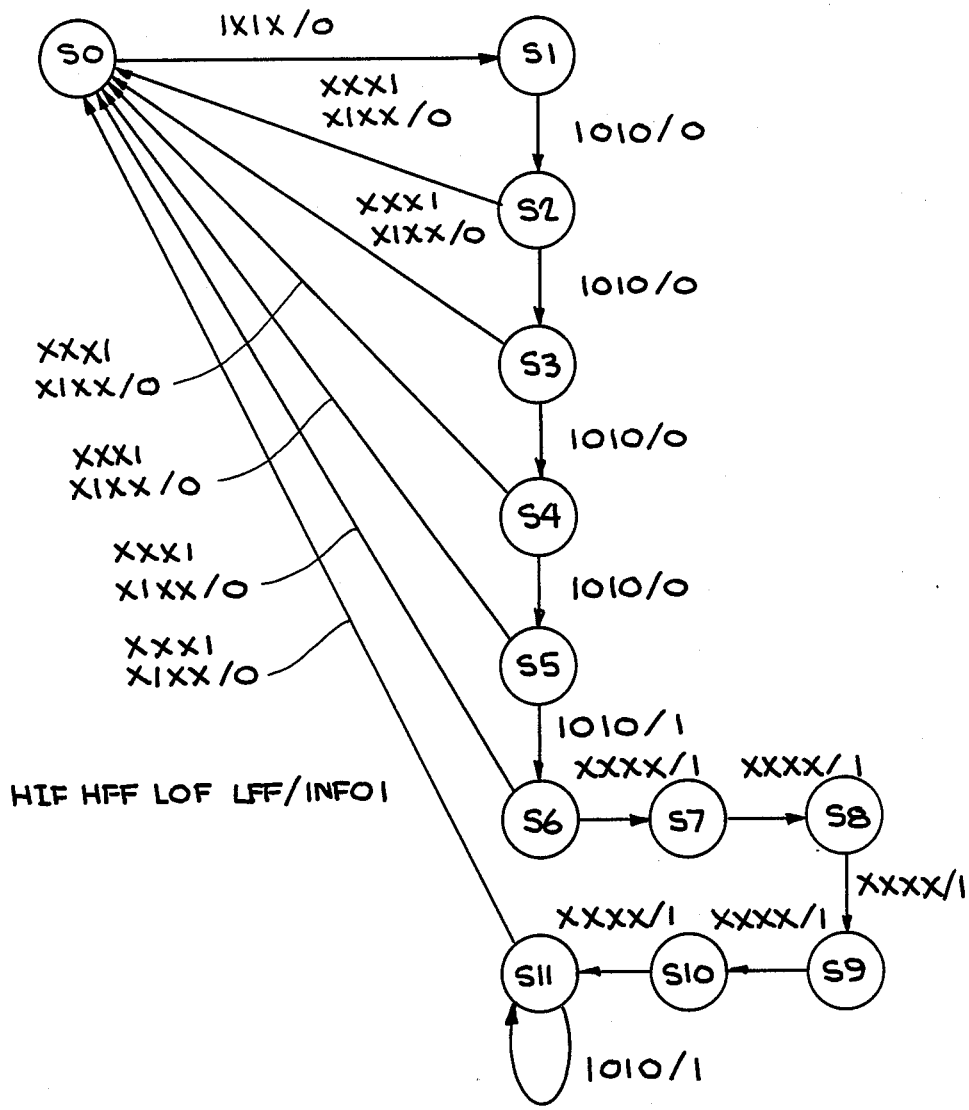

One implementation of the INFO__1 detection technique of the instant invention is illustrated in three state diagrams; FIG. 2A is a state diagram of the HIGH and LOW mark detector 12 and 14, FIG. 2B is a state diagram of the frame detector 16 and 18 and FIG. 2C is a state diagram of the INFO__1 frame counter 20. Each state diagram consists of a set of nodes, indicated by a circle, each node representing a state, and a set of branches, indicated by directed line segments, each branch representing a transition between the state at the tail of the branch and the state at the head of the branches. Each branch has a label adjacent to it of the form I/O, where I indicates the signal(s) received by the device to which the diagram pertains and O indicates the signals generated by the device for this input. An "X" indicates "don't care".

For instance, in FIG. 2A reception of a "1" (indicating reception of an IN signal in the case of HIGH mark detector 12) and a "don't care" reset signal when in state S1 causes the MHI signal not to be generated (a "0") and entry into state S2. Reception of a "0" (indicating no reception of an IN signal) and a "don't care" reset signal when in state S1 causes the MHI signal not to be generated and entry into state S0. The initial state of diagram shown in FIG. 2A is state S0 and corresponds to the initial condition of the detector 12 or 14 upon power on. Reception of the reset signal at the R terminal, when in any state, causes entry to state S10 upon reception of a signal at the IN terminal of detector 12 or 14 and upon this signal deceasing, entry to the start state S0.

As will be appreciated by those skilled in the art, the state diagrams of FIGS. 2A, 2B and 2C can readily be implemented as programmable logic arrays (PLA's). Thus each block of the detector 10 of FIG. 1 can be constructed from a PLA integrated circuit.

What is claimed is:

1. A method for detection of a pattern occurring within a time interval of a predetermined period in signals received at a first rate on a transmission line, said signals including a HIGH mark signal and a LOW mark signal, comprising the steps:
    (a) sampling said signals at a second rate being a multiple of said first rate and detecting the occurrence of said HIGH mark or said LOW mark;
    (b) sampling said signals at said first rate and detecting the occurrence of said LOW mark or said HIGH mark, when said HIGH mark or said LOW mark, respectively, was detected in sampling step (a);
    (c) detecting at consecutive intervals said mark detected in step (a);
    (d) detecting at consecutive intervals said mark detected in step (b); and
    (e) detecting for a predetermined number of consecutive intervals said conditions detected in steps (a), (b), (c) and (d).

2. A signal pattern detection method according to claim 1, wherein each said interval comprises a plurality of subintervals each having a position designator; step (e) further calls for ascertaining that for each of said predetermined number of consecutive intervals the conditions detected in steps (a), (b), (c) and (d) occur in the same rel. tive positions within each said interval.

3. A signal pattern detection method according to claim 1 wherein said sampling (second) rate is four times said received (first) rate.

4. A signal pattern detection method according to claim 3 wherein said sampling rate is 768 kbs and said received rate is 192 kbs.

5. A signal pattern detection method according to claim 1 wherein step (e) calls for detecting for six consecutive intervals said conditions detected in steps (a), (b), (c) and (d).

6. A signal pattern detection method according to claim 1 wherein said received signals have eight-bit time intervals periods.

* * * * *